Oct. 29, 1968 J. O. REDWANZ 3,408,451

ELECTRICAL DEVICE PACKAGE

Filed Sept. 1, 1965 2 Sheets-Sheet 1

James O. Redwanz
INVENTOR.

BY John H. Graham

INVENTOR
James O. Redwanz

BY John G. Graham
ATTORNEY

United States Patent Office 3,408,451
Patented Oct. 29, 1968

3,408,451

ELECTRICAL DEVICE PACKAGE

James O. Redwanz, Richardson, Tex., assignor to Texas Instruments Incorporated, Dallas, Tex., a corporation of Delaware Continuation-in-part of application Ser. No. 414,994, Dec. 1, 1964. This application Sept. 1, 1965, Ser. No. 485,633
8 Claims. (Cl. 174—52)

ABSTRACT OF THE DISCLOSURE

Disclosed is a stud-type power rectifier package which includes a hard metal threaded stud base with a soft metal enclosing wall mounted on the base and a cover cold-welded to the wall portion, the cover including a terminal through which electrical contact may be made to a semiconductor device enclosed within the package.

Figure 1:
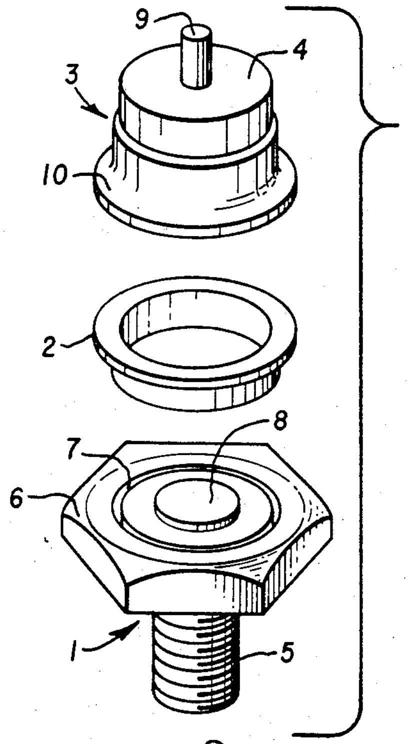

This application is a continuation-in-part of application Ser. No. 414,994, filed Dec. 1, 1964, now abandoned. The invention relates to electrical device packages, and in particular, to electrical device packages incorporating studs or other metallic bases on which semiconductor assemblies may be mounted.

Some semiconductor assemblies, such as semiconductor power rectifiers, for example, are mounted on metallic bases such as studs. In such a device a protective cap is placed over the semiconductor assembly, and the cap is hermetically bonded to the stud.

The bond between the cap and the stud is preferably not made by hot-welding or brazing as weld splash and heat can damage the semiconductor assembly. The bond is more advantageously made by cold-weld. However, when the cold-weld is made directly to the stud head, a bending moment in the stud often causes damaging stresses in the semiconductor assembly mounted on the stud. Also, since copper alloys are very difficult to cold-weld, a substantially pure copper, such as OFHC copper (a trademark of American Metal Climax, Inc.), has been utilized primarily for the stud material. However, OFHC copper does not retain hardness and tensile strength so well as copper alloys when subjected to heat. Therefore, since the stud is subjected to some thermal treatments in manufacturing, the annealed pure copper stud usually has considerably less tensile strength and hardness than would a copper alloy stud.

It is an object of this invention to provide an improved package for electrical devices, particularly semiconductor power rectifiers, which permits sealing by cold-welding of soft metals having desired mechanical properties. A particular object is to provide a cold-welded stud-type power rectifier package of a construction which does not necessitate the application of stresses or bending moments to the support or base for the semiconductor wafer in the cold-welding operation. A feature of the invention is heat radiating fins which maximize dissipation of the heat generated from the operation of the electrical device.

In accordance with the invention, an electrical device package is provided which utilizes a unique composite stud arrangement including a hard metal stud and a soft metal sealing ring. The stud provides a rigid support for the electrical device, ordinarily a fragile semiconductor chip, and usually includes a threaded shank for mounting the completed unit on a heat sink. The ring is brazed or otherwise affixed to the stud, and includes a flange or the like suitable for permitting cold-welding of a cap thereto. The ring may also include a plurality of flanges or fins to increase heat dissipation. An important feature of the invention is the location of the sealing flange away from the stud so that the dies used for the welding operation will not bear upon the stud itself.

Figure 2A:
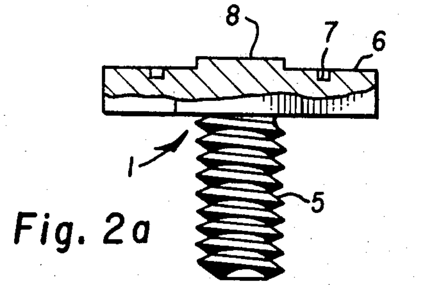
Figure 2B:
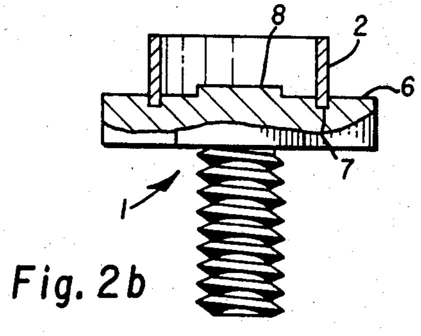
Figure 2C:
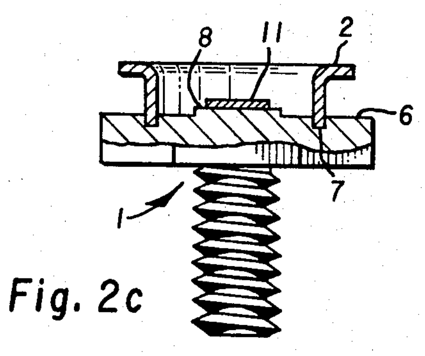
Figures 2D, 2E:
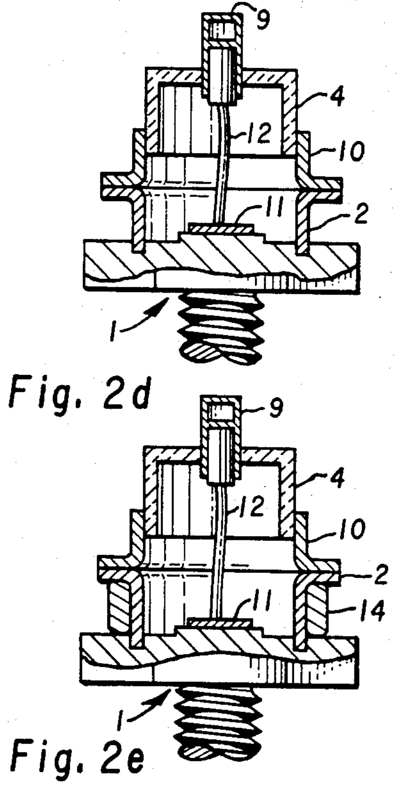
Figure 3A:
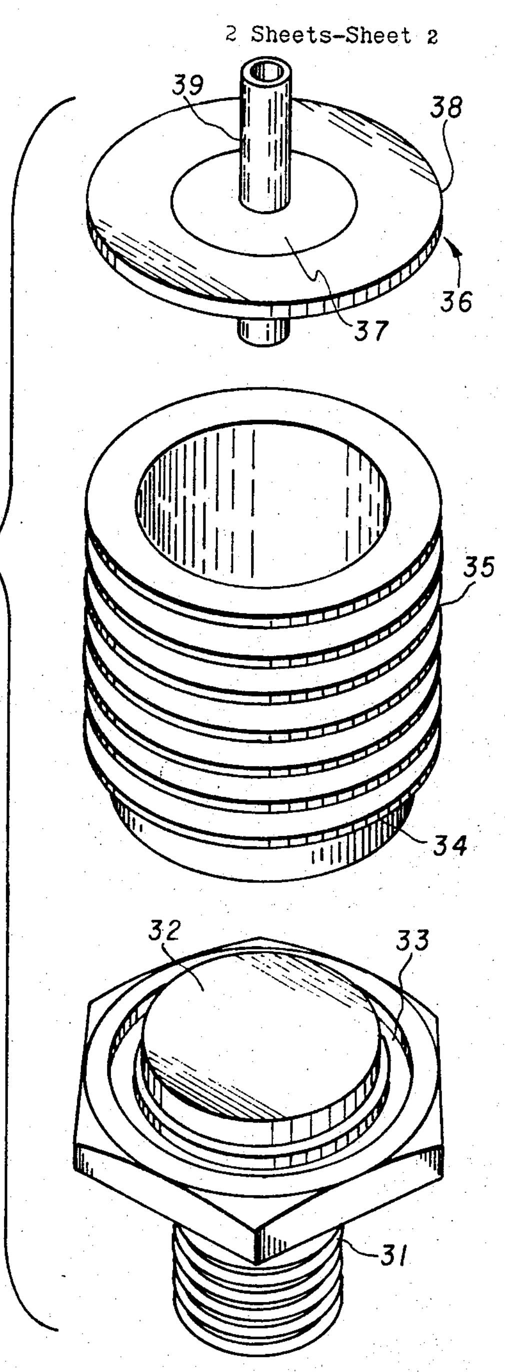
Figure 3B:
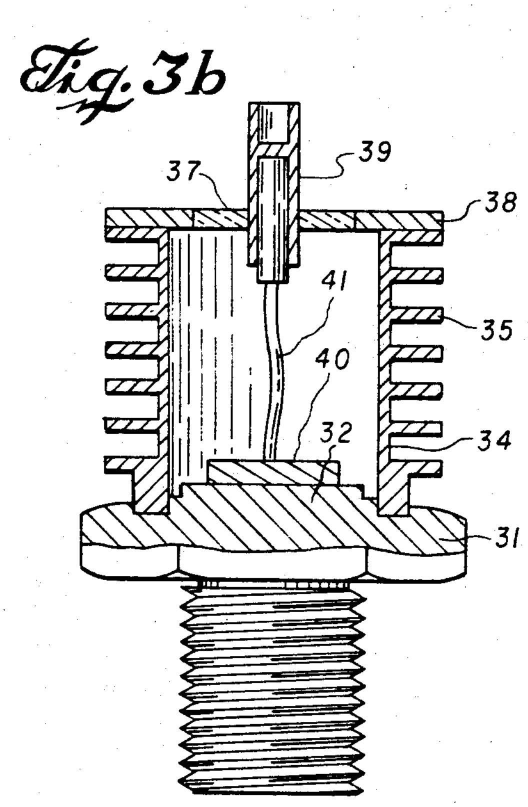

The novel features believed characteristic of the invention are set forth in the appended claims. The invention itself, as well as other objects and features thereof, will become more readily understood from the following detailed description of illustrative embodiments, when considered in conjunction with the accompanying drawings, in which:

FIGURE 1 is an exploded pictorial view of one embodiment of the composite stud and device package, FIGURES 2*a*–2*e* are cross-sectional views of the composite stud and device package at several stages in production, FIGURE 3*a* is an exploded pictorial view of another embodiment of the composite stud and device package in which heat radiating fins are provided, and FIGURE 3*b* is a sectional view of an assembled device of the kind illustrated in FIGURE 3*a* with a semiconductor element enclosed therein.

Referring to FIGURE 1 of the drawing, a hard metal stud 1 is provided which comprises a threaded shank 5, a head 6, a circular groove 7 formed in said head, and a pedestal 8 raised on said head. An annular piece 2, composed of soft metal, has a flange on one end and an inside diameter and outside diameter such that the end opposite the flange will fit into the circular groove 7. A cap 3 includes a ceramic body 4 through one end of which is an electrical contact 9 and around the other end of which is secured a metallic annular piece 10 having diameters and flange width of about the same dimensions as the diameters and flange width, respectively, of the annular piece 2. The piece 10 is composed of soft metal to permit pressure welding to the piece 2.

FIGURES 2*a*–2*e* illustrate in cross section the composite stud and device package during production. FIGURE 2*a* shows the stud 1 with a grooved head 6 and a pedestal 8. Of course, other stud bodies, such as a flat-headed stud or a stud with a head having a raised rim, for example, are feasible. The stud is preferably made of a copper-base alloy such as Amzirc (an American Metal Climax copper alloy), or PD–135 (a Phelps-Dodge copper allow). However, the stud could be made of steel, brass, bronze or other suitable material exhibiting satisfactory mechanical, thermal, and electrical properties.

In FIGURE 2*b*, the annular piece 2 is placed in the groove 7 of the stud head 6. The annular piece could be altered by having a flange on either end, for example, to accommodate stud designs having a wider groove or no groove. The annular piece 2 is preferably made of OFHC copper or other suitable material capable of being cold-welded.

In FIGURE 2*c*, the annular piece 2 is bonded, for example by brazing or soldering, in the groove 7 of the stud head 6, and a flange is formed by upsetting the upper end of the annular piece 2. The flange could, of course, be formed before the annular piece 2 is bonded to the stud. After the bonding process, a semiconductor assembly 11 may be affixed to the stud pedestal 8. The semiconductor assembly 11 would ordinarily comprise a fragile semiconductor chip or wafer several hundred mils in diameter but only a few mils in thickness. The wafer would include one or more P-N junctions to provide a power rectifier or controlled rectifier.

In FIGURE 2*d*, the end of a lead contact 12 from the semiconductor assembly 11 is fitted into the cap contact 9. The cap 3 is then placed on the annular piece 2 so that the flanges of the two bodies 2 and 3 are in contact. The annular piece 10 of the cap 3 is OFHC copper or other suitable material capable of being cold-welded to the annular piece 2. The cap 3 is hermetically bonded to the annular piece 2 by cold-welding the two flanges together. Finally, the lead contact 12 is permanently fastened to the cap contact 9 by crimping the cap contact 9 and the lead contact 12.

The cold-weld techniques utilized for the structure as shown in FIGURE 2*d* employs "split-die" tooling wherein two opposing tool fixtures have semi-circular jaws capable of grasping the annular piece 2 between the flange of said annular piece and the stud head 6. The tool fixtures serve as a base support during the cold-weld, thus producing no bending moment and accompanying stress in the stud head. With the semi-circular jaws in place beneath the flange of the piece 2, a mating circular die is brought to bear upon the top of the flange on the piece 10, effecting a cold-weld. The semi-circular fixtures are retracted after the cold-weld.

The cold-weld technique could be applied to the "anvil" construction illustrated in FIGURE 2*e*, which incorporates a ring 14 of steel or other hard material as a component necessary to the cold-weld technique. The ring 14 is placed around the annular piece 2 after said piece is bonded in the groove 7 of the stud 1.

FIGURE 3*a* illustrates another embodiment of the invention in which heat radiating fins are provided. Again, a hard metallic stud 31 is provided with a pedestal 32 and a circular groove 33 formed in the stud head. An annular piece 34 of OFHC copper, for example, includes a plurality of flanges or fins 35 to increase heat dissipation. The heighth of the annular piece 34 may be sufficient to allow a flat enclosing top 36 rather than a cap as described earlier. The top 36 comprises a ceramic portion 37 and a metal flange 38. The ceramic portion 37 is provided with an electric contact 39. The device is assembled in a manner as described for the device illustrated in FIGURE 2*d*. FIGURE 3*b* is a sectional view of the assembled device with a semiconductor body 40 affixed to the stud pedestal 32 and the lead 41 electrically connecting the semiconductor body and the electrical contact 39. The flange 38, of OFHC copper or other suitable material, is cold-welded to the upper flange of the annular piece 34. The finned portion of this package, when coated with a dielectric material such as Teflon, for example, increases the leakage path between the electrical contact 39 and the stud 31. This is an important feature in high voltage power devices.

This novel composite stud provides a base for the semiconductor assembly with satisfactory mechanical properties to protect the assembly from damaging stresses. An important feature is that the cold-weld is not made directly to the stud head; therefore, the cold-weld will not transmit a damaging bending moment to the stud pedestal and device assembly.

The particular embodiments employed to describe the invention relate to the composite studs and device packages shown in the drawings. Of course, the semiconductor assembly could be mounted to the stud without the need for a pedestal on the stud head. The annular piece could be bonded to a stud head not having a groove. Also, the stud could be replaced by a metallic base not having a shank. Numerous other arrangements may be devised by those skilled in the art without departing from the spirit and scope of the invention as defined by the appended claims.

What is claimed is:

1. An electrical device and package the combination comprising a hard metallic stud body having a shank and a head, said device being mounted on said head, said head having a circular groove therein; a malleable metallic annular piece forming a wall portion of said package, one end of said piece being fitted in said circular groove and bonded to said stud head, the other head of said annular piece having a flange; and a cap having a metallic flange at its open end cold-welded to the flange of said annular piece.

2. An electrical device package according to claim 1 wherein said cap has a ceramic portion to which the metal flange is secured, said ceramic portion having a metallic electrically conductive terminal extending therethrough.

3. The electrical device package according to claim 1 wherein a hard metallic ring is placed around said malleable metallic annular piece between the flange of said annular piece and the head of said stud body.

4. The electrical device package according to claim 1 wherein said metallic annular piece has a plurality of flanges extending around the circumference of said piece and wherein one of said flanges is bonded to said cap.

5. An electrical device and package the combination comprising a hard metallic stud body having a shank and a head, said device being mounted on said head, said head having a circular groove therein; a soft metallic annular piece with one end fitted in said circular groove forming a wall portion of said package and bonded to said stud head, the other end of said annular piece having a flange; a hard metallic ring around said annular piece and resting between the head of said stud and the flange of said annular piece; and a cap having a metallic flange at its open end cold-welded to the flange of said annular piece.

6. An electrical device package comprising a hard metallic stud body having a head and a shank, a semiconductor assembly mounted on said stud head, a soft metallic annular piece around said semiconductor assembly forming an enclosing wall portion of said package, one end of said annular piece bonded in a groove to said stud head and the other end having a flange, a cap with a metallic flange at its open end and an ohmic contact through its closed end, an ohmic lead contact from said semiconductor assembly to said contact through said cap, and the flange of said cap bonded to the flange of said annular piece.

7. An electrical device and package, said package comprising a metallic barrier having a threaded stud on one end thereof, said metallic base having an annular groove therein, said device being mounted on said metallic base, a malleable metal annular piece with one end bonded within said annular groove and the end opposite said bonded end having a flange, said annular piece forming an enclosing wall of said package, and a cap having a flange bonded to the flange of said annular piece.

8. An electricl device package comprising a hard metallic base, said base having an annular groove therein,
a semiconductor assembly mounted on one surface of said base, a malleable metallic annular piece around the semiconductor assembly forming one wall of said package, said annular piece having a plurality of heat dissipating flanges, one end of said annular piece being bonded to said base within said groove, an enclosing piece cold-welded to a flange of said annular piece, and an ohmic lead contact from said semiconductor assembly to an ohmic contact through said enclosing piece.

References Cited

UNITED STATES PATENTS

| | | | |
|---|---|---|---|
| 2,862,158 | 11/1958 | Stelmak et al. | |
| 3,065,390 | 11/1962 | Boswell et al. | |
| 2,941,688 | 6/1960 | Chamberlain et al. | |
| 3,005,867 | 10/1961 | Green et al. | 174—50.54 |
| 3,020,454 | 2/1962 | Dixon. | |
| 3,198,874 | 8/1965 | Dahl | 174—52 |
| 3,209,218 | 9/1965 | Zielasek et al. | |

FOREIGN PATENTS

| | | |
|---|---|---|
| 914,034 | 12/1962 | Great Britain. |

LARAMIE E. ASKIN, *Primary Examiner.*